United States Patent [19]
Yoo

[11] Patent Number: 6,025,270
[45] Date of Patent: Feb. 15, 2000

[54] PLANARIZATION PROCESS USING TAILORED ETCHBACK AND CMP

[75] Inventor: Chue-San Yoo, Hsin-chu, Taiwan

[73] Assignee: Taiwan Semiconductor Manufacturing Company, Ltd., Hsin-Chu, Taiwan

[21] Appl. No.: 08/794,693

[22] Filed: Feb. 3, 1997

[51] Int. Cl.[7] .................................................. H01L 21/302
[52] U.S. Cl. ........................ 438/697; 438/626; 438/633; 438/645; 438/723; 438/704; 438/734; 438/750; 216/57; 216/89; 216/99
[58] Field of Search .................................... 438/626, 633, 438/645, 693, 697, 700, 719, 720, 723, 734, 704, 749, 750; 216/57, 89, 99, 80, 77; 430/5

[56] References Cited

U.S. PATENT DOCUMENTS

| | | |
|---|---|---|
| 4,954,459 | 9/1990 | Aranzino et al. ..................... 437/228 |
| 5,015,602 | 5/1991 | Van Der Plas et al. ................... 437/67 |
| 5,350,486 | 9/1994 | Huang ........................................ 156/633 |
| 5,492,858 | 2/1996 | Bose et al. ................................ 437/67 |
| 5,498,565 | 3/1996 | Grocho et al. ........................... 437/67 |
| 5,874,779 | 2/1999 | Matsuno .................................. 438/622 |

FOREIGN PATENT DOCUMENTS

| | | |
|---|---|---|
| 4-307735 | 10/1992 | Japan . |
| 7-147278 | 6/1995 | Japan . |

*Primary Examiner*—Benjamin L. Utech
*Assistant Examiner*—George Goudreau
*Attorney, Agent, or Firm*—George O. Saile; Stepehen B. Ackerman

[57] ABSTRACT

An improved and new method for forming a planarized integrated cirsuit structure has been developed. The method uses a combination of etchback and chemical/mechanical polishing (CMP), in which the etchback process uses a tailored mask to compensate for non-unifomity of material removal by the subsequent chemical/mechanical (CMP) process, thereby resulting in improved planarization and superior thickness uniformity.

9 Claims, 4 Drawing Sheets

PLANARIZATION PROCESS USING TAILORED ETCHBACK AND CMP

BACKGROUND OF THE INVENTION

(1) Field of the Invention

This invention relates to a method of fabrication used for semiconductor integrated circuit devices, and more specifically to an improved process for chemical/mechanical planarization (CMP) of an insulating layer deposited over topography on a semiconductor substrate.

(2) Description of Related Art

Chemical/mechanical polishing (CMP) has been developed for providing planar topographies on surfaces deposited on semiconductor substrates. For example, rough topography results when metal conductor lines are formed over a substrate containing device circuitry. The metal conductor lines serve to interconnect discrete devices, and thus form integrated circuits. The metal conductor lines are further insulated from the next interconnection level by thin layers of insulating material and holes formed through the insulating layers provide electrical access between successive conductive interconnection layers. In such wiring processes, it is desirable that the insulating layers have a smooth surface topography, since it is difficult to lithographically image and pattern layers applied to rough surfaces.

Briefly, the CMP processes involve holding and rotating a thin, flat substrate of the semiconductor material against a wetted polishing surface under controlled chemical, pressure, and temperature conditions. A chemical slurry containing a polishing agent, such as alumina or silica, is used as the abrasive material. Additionally, the chemical slurry contains selected chemicals which etch various surfaces of the substrate during processing. The combination of mechanical and chemical removal of material during polishing results in superior planarization of the polished surface.

Alternate planarization processes have, also, been developed. U.S. Pat. No. 5,051,602 entitled "Method of Manufacturing a Semiconductor Device Having a Planarized Construction" granted May 14, 1991 to Paulus A. Van Der Plas et al describes a method of planarization of a first layer deposited over topography, in which the first layer is pre-planarized by providing a photoresist mask over depressed areas and etching the unprotected first layer to form a partially planarized surface of the first layer. Next a second planarizing layer is applied, followed by a blanket etchback step which etches the second planarizing layer and the first layer at substantially the same rate. The second planarizing layer is completely removed and the first layer is etched producing a planar surface.

U.S. Pat. No. 4,954,459 entitled "Method of Planarization Of Topologies In Integrated Circuit Structures" granted Sep. 4, 1990 to Steven C. Avanzino et al describes a method of planarization of an oxide layer deposited over topography, in which a patterned photoresist mask is applied with openings in registry with raised portions of the oxide layer. The raised oxide portions are etched down to approximately the same height as low portions of the oxide layer; then the photoresist mask is removed; and chemical/mechanical polishing (CMP) is used to produce a planarized surface.

U.S. Pat. No. 5,350,486 entitled "Semiconductor Planarization Process" granted Sep. 27, 1994 to Kuei-Wu Huang describes a method for planarizing an oxide layer deposited over topography, in which a layer of spin-on glass is first formed over the oxide layer, followed by formation of a patterned photoresist mask with openings in registry with raised portions of the spin-on glass. Next, the regions of the spin-on glass and oxide underlying the openings in the photoresist mask are partially etched; then the photoresist mask is removed; and blanket etchback of the spin-on glass and exposed oxide produces a relatively planar surface.

While these inventions result in improvements to the planarization processes they do not result in completely planar surfaces because of the implicit non-uniformities of the various process steps.

The present invention is directed to a novel and improved method for the formation of a planarized layer over topographic features on a semiconductor substrate. The novel and improved method compensates for non-uniformity of material removal during chemical/mechanical polishing (CMP) and results in a planarized layer having more uniform thickness.

SUMMARY OF THE INVENTION

One object of the present invention is to provide an improved method of fabricating a planarized integrated circuit structure having planarized oxide layer portions.

Another object of the present invention is to provide a new and improved process for fabricating a planarized integrated circuit structure resulting in planarized oxide layer portions having superior thickness uniformity.

A further object of the present invention is to provide a new and improved process for fabricating a planarized integrated circuit structure using a combination of etchback and chemical/mechanical polishing (CMP), in which the etchback process is tailored to compensate for non-uniformity of material removal by the chemical/mechanical (CMP) process, thereby resulting in improved planarization and superior thickness uniformity.

In accordance with the present invention, the above and other objectives are realized by using a method of forming a planarized integrated circuit structure having planarized oxide layer portions, comprising the steps of: providing the oxide layer on the surface of the integrated circuit structure; applying a patterned mask layer over the oxide layer with mask regions in registry with depressed portions of the oxide layer and with a periodic array of masked and unmasked regions over the raised portions of the oxide layer, with the size and periodicity of the periodic array of masked and unmasked regions being chosen to enhance subsequent chemical/mechanical polish (CMP) removal uniformity; etching exposed portions of the oxide layer through unmasked regions of the patterned mask layer to approximately the same height as the height of the depressed portions of the oxide layer; removing the patterned mask layer; and chemical/mechanical polishing (CMP) the remaining portions of the oxide layer to obtain a planarized oxide layer having uniform thickness and a smooth surface.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method for fabricating a planarized integrated circuit structure using a combination of etchback and chemical/mechanical polishing (CMP) will now be described in detail. The invention provides an improved method for forming planarized oxide surfaces in integrated circuit structures wherein oxide is used between active or conductive regions formed in or on an integrated circuit structure.

Figure 1:
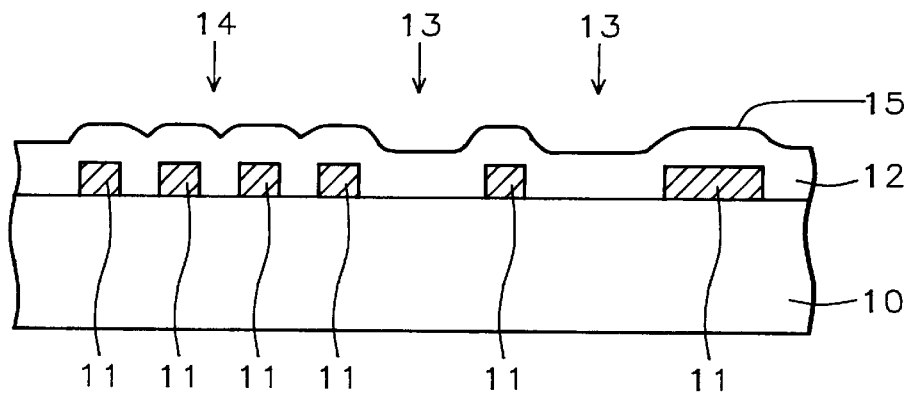
FIGS. 1–5, which schematically, in cross-sectional representation, illustrate the method of one embodiment of the present invention.

Referring to FIGS. 1–5, an embodiment of the method of the invention is shown starting with FIG. 1 which illustrates an integrated circuit structure, 10, which may include previously formed active devices in or on the surface of a silicon substrate. Formed on the integrated circuit structure, 10, is a patterned metallization interconnection structure, 11, and a conformal insulator layer, 12. The patterned metallization interconnection structure, 11, comprises a patterned conductor such as an aluminum or aluminum-copper-silicon layer having a thickness between about 2000 and 8000 Angstroms. Alternately, the patterned conductor may be any conductor conventionally used in forming integrated circuit interconnections, such as polysilicon, tungsten or tungsten polycide. The patterned metallization interconnection structure, 11, has regions of closely spaced conductor lines and spaces, designated as region, 14, and regions, 13, of wider spacing between adjacent conductor lines. For example, region 14 may result from a closely packed array of conducting lines and spaces as would result in a memory device array. In sub-micron technology currently used for densely populated integrated circuits the minimum width of the conducting lines is between about 3000 to 5000 Angstroms and the minimum space between adjacent conducting lines is between about 3000 to 5000 Angstroms. The wider spacing of region, 13, results from less densely packed global wiring interconnection lines.

The conformal insulator layer, 12, may be silicon oxide deposited over the patterned metallization interconnection structure using conventional deposition processes, such as LPCVD (Low Pressure Chemical Vapor Deposition), CVD (Chemical Vapor Deposition), or PECVD (Plasma Enhanced Chemical Vapor Deposition). Alternately, the conformal insulator layer, 12, may be formed from spin-on glass or a combination of deposited oxide and spin-on glass. The thickness of the conformal insulator layer, 12, over a wide space, 13, between adjacent metallization patterns must be greater than the thickness of the metallization pattern. For example, when the metallization pattern has a thickness of about 5000 Angstroms, the thickness of the conformal insulator over wide space, 13, should be about 10,000 Angstroms. Greater thicknesses of conformal insulator may be used, but are unnecessary. Usually the thickness of the conformal insulator will be greater than the thickness of the metallization pattern by about 5000 Angstroms up to about 10,000 Angstroms. The thickness of the conformal insulator layer may vary by about ±10%. In regions of closely packed arrays of conducting lines and spaces the conformal insulator layer completely fills the space between adjacent conducting lines. And, over a wide conducting line the full thickness of the conformal insulating layer is deposited. The result as illustrated is a non-planarized surface, 15, following deposition of the conformal insulating layer.

Figure 2:
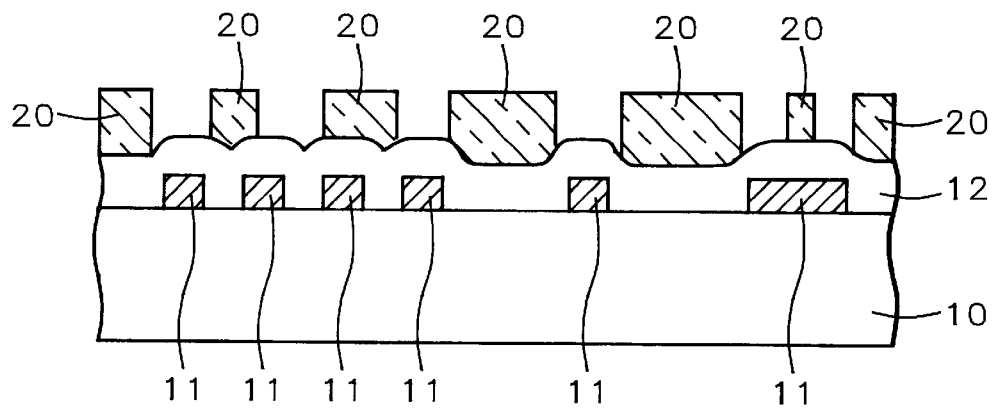

Now referring to FIG. 2, a masking material, 20, such as a photoresist mask is now formed over the structure shown in FIG. 1. In the art, (See, for example, U.S. Pat. No. 4,954,459), the photoresist mask is patterned using a photolithographic mask which is the reverse of the mask used to pattern the metallization interconnection structure. However, this method is inadequate when adjacent conducting lines are closely spaced as is the case in densely packed integrated circuit memory arrays. For example, in densely packed arrays the conducting line width may be 0.2 $\mu$m with a 0.4 $\mu$m space between adjacent conducting lines. A reversed and oversized mask would require a photoresist mask having a width of 0.5 $\mu$m and a 0.1 $\mu$m space between adjacent photoresist mask features. Current photolithographic imaging and photoresist developing technologies cannot resolve the 0.1 $\mu$m space and use of this art would result in a deficient mask for the purpose of etchback of the insulating layer. In our present invention the masking material, 20, is a tailored photoresist mask and is not an exact reversal of the mask used to pattern the metallization interconnection structure. This tailored photoresist mask has mask regions in registry with depressed portions of the conformal insulating layer, but over raised portions of the conformal insulating layer this tailored photoresist mask has a periodic array of masked and unmasked regions formed in photoresist. The size and periodicty of the array of masked and unmasked regions are chosen to: 1) Allow resolution of the photoresist pattern by current lithographic technologies and 2) Create a mask pattern, which when used to etchback the insulating layer will, after etchback, form a raised pattern in the remaining insulating layer which will enhance the subsequent chemical/mechanical polish (CMP) removal process. In CMP the polish removal rate is increased on features of larger height compared to features with smaller height. Also, planarization of surface features depends upon their lateral dimensions for a given feature height. The local polish removal rate over a feature with small lateral dimensions is higher than the local polish removal rate over a feature with large lateral dimensions. Furthermore, the local polish removal rate on a topographic feature is influenced by the proximity of other topographic features. For example, an isolated feature of a given height will polish faster than a like feature which is closely surrounded by an array of similar features. Therefore, it is possible to tailor the photoresist mask pattern used during etchback of the insulating layer so that, after insulating layer etchback, the raised pattern in the remaining insulating layer enhances the CMP material removal process and compensates for non-uniformities in the CMP material removal process. For example, the periodic array of masked and unmasked area regions over the raised portions of the insulating layer has masked area features with dimensions between about 0.3 $\mu$m by 0.3 $\mu$m to 1.0 $\mu$m by 1.0 $\mu$m with spacing between the masked area features of about 0.3 $\mu$m and 0.5 $\mu$m.

Figure 3:
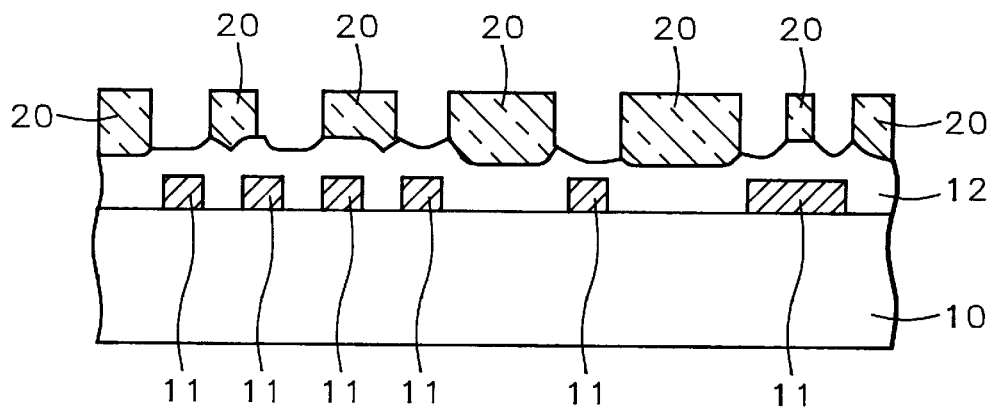

As illustrated in FIG. 3, after formation of the masking material, 20, the unmasked insulating layer is etched through unmasked regions to approximately the same height as the height of the depressed portions of the insulating layer. The etching may comprise an isotropic etch using plasma etching in an ambient containing oxygen and fluorine radicals, or may comprise an isotropic wet etch using a solution of HF and $H_2O$.

Figure 4:
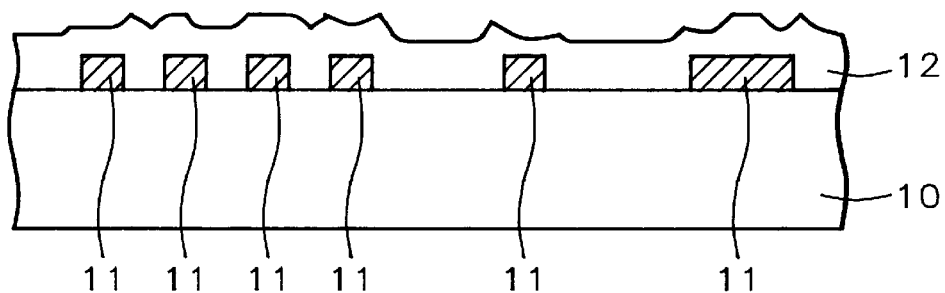
Figure 5:
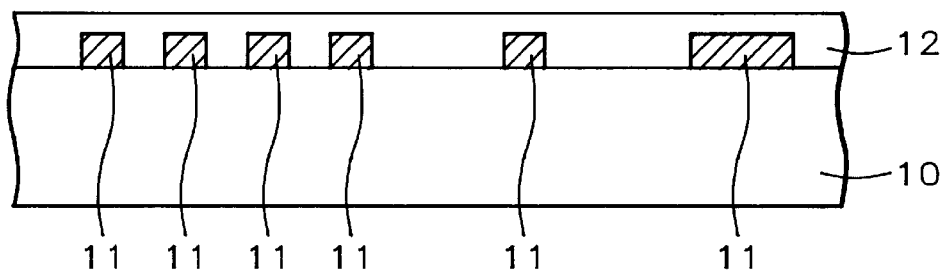

Following etchback of the unmasked insulating layer the mask is removed, as illustrated in FIG. 4. Planarization is then achieved using CMP (Chemical Mechanical Polishing), using a polishing slurry containing abrasive particles and a chemical etchant. CMP removes raised portions of insulating material remaining on the substrate and results in the planarized structure, illustrated in FIG. 5. This combination of tailored insulating layer etchback and CMP results in improved planarization and a smooth insulating layer having improved thickness uniformity after planarization.

Figure 6:
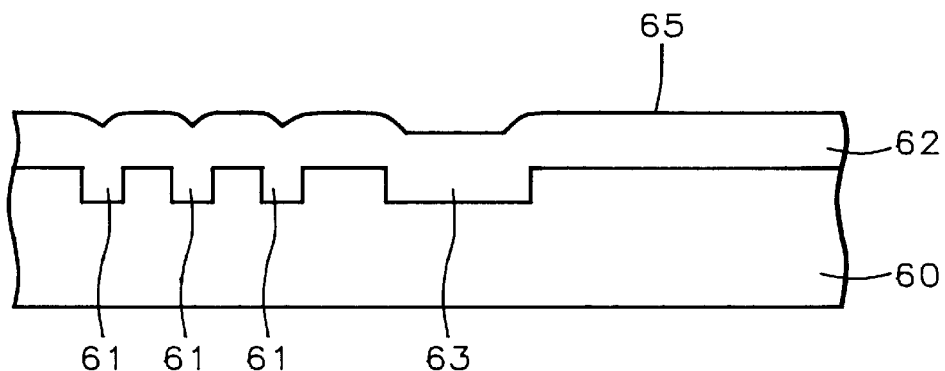
FIGS. 6–10, which schematically in cross-sectional representation, illustrate the method of a second embodiment of the present invention.

A second embodiment of the method of the present invention is illustrated in FIGS. 6–10. In FIG. 6 is illustrated schematically in cross-sectional representation a semiconductor substrate, 60, having etched channels or grooves, 61, and a conformal insulator layer, 62. The conformal insulator layer, 62, may be silicon oxide deposited over the semiconductor substrate, 60, and etched channels or grooves, 61, by conventional deposition processes, such as LPCVD (Low Pressure Chemical Vapor Deposition), CVD (Chemical Vapor Deposition), or PECVD (Plasma Enhanced Chemical Vapor Deposition). Alternately, the conformal insulator layer, 62, may be formed from spin-on glass or a combination of deposited oxide and spin-on glass. The thickness of the conformal insulator layer, 62, over a wide channel, 63, must be greater than the depth of the channel. For example, when the channel has a depth of about 0.3 $\mu$m, the thickness of the conformal insulator over wide channel, 63, should be about 0.5 $\mu$m. Greater thicknesses of conformal insulator may be used, but are unnecessary. Usually the thickness of the conformal insulator will be greater than the depth of the channel by about 0.3 $\mu$m up to about 0.5 $\mu$m. The thickness of the conformal insulator layer may vary from about 0.4 $\mu$m to 1.0 $\mu$m. Narrow channels are completely filled by the conformal insulating layer. The result as illustrated is a non-planarized surface, 65, following deposition of the conformal insulating layer.

Figure 7:
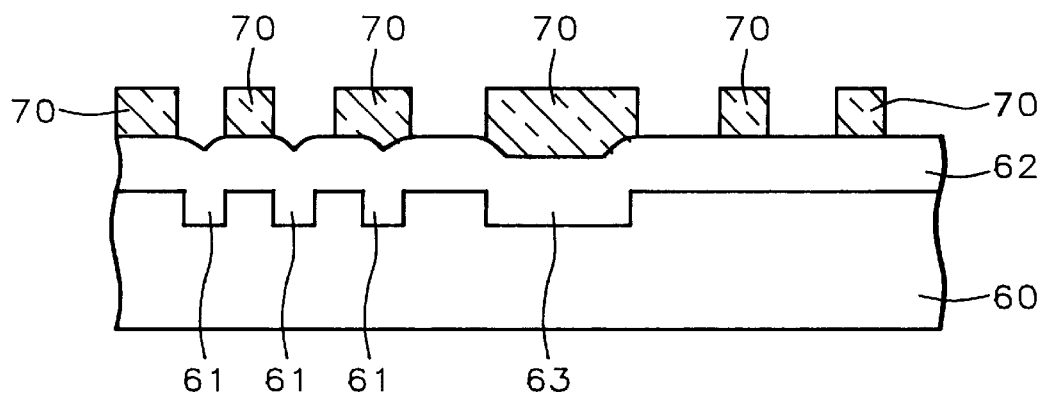

Now referring to FIG. 7, a masking material, 70, such as a photoresist mask is now formed over the structure shown in FIG. 6. As in the first embodiment of the present invention, the masking material, 70, is a tailored photoresist mask and is not an exact reversal of the mask used to pattern the channel or groove structure. This tailored photoresist mask has mask regions in registry with depressed portions of the conformal insulating layer, but over raised portions of the conformal insulating layer this tailored photoresist mask has a periodic array of masked and unmasked regions formed in photoresist. The size and periodicty of the array of masked and unmasked regions are chosen to: 1) Allow resolution of the photoresist pattern by current lithographic technologies and 2) Create a mask pattern, which when used to etchback the insulating layer will, after etchback, form a raised pattern in the remaining insulating layer which will enhance the subsequent chemical/mechanical polish (CMP) removal process. For example, the periodic array of masked and unmasked area regions over the raised portions of the insulating layer has masked area features with dimensions between about 0.3 $\mu$m by 0.3 $\mu$m to 1.0 $\mu$m by 1.0 $\mu$m with spacing between the masked area features of about 0.3 $\mu$m and 0.5 $\mu$m.

Figure 8:
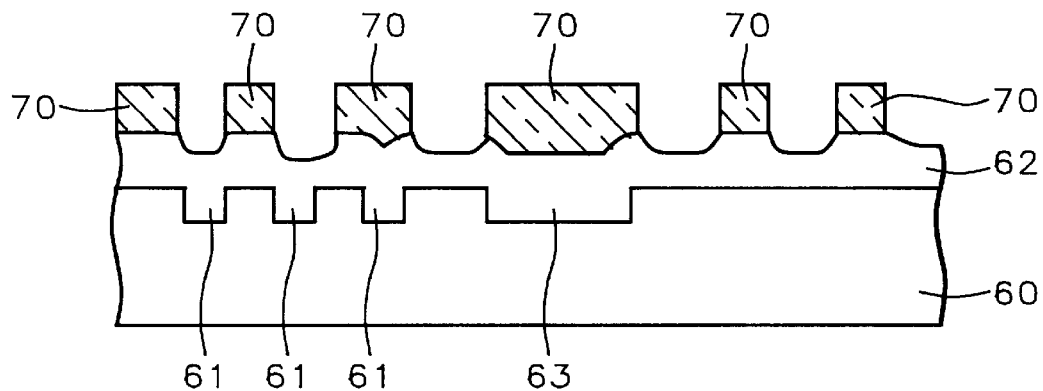

As illustrated in FIG. 8, after formation of the masking material, 70, the unmasked insulating layer is etched through unmasked regions to approximately the same height as the height of the depressed portions of the insulating layer. The etching may comprise an isotropic etch using plasma etching in an ambient containing oxygen and fluorine radicals, or may comprise an isotropic wet etch using a solution of HF and H$_2$O).

Figure 9:
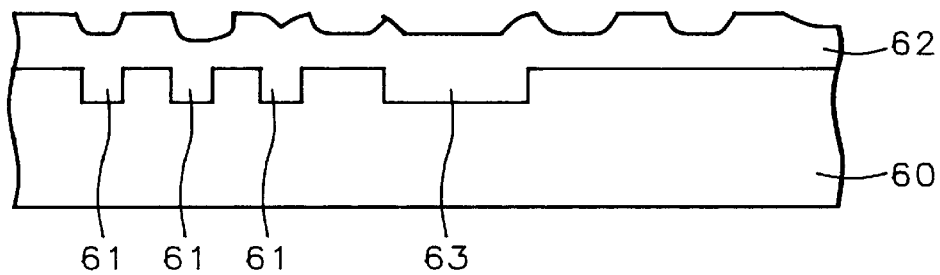
Figure 10:
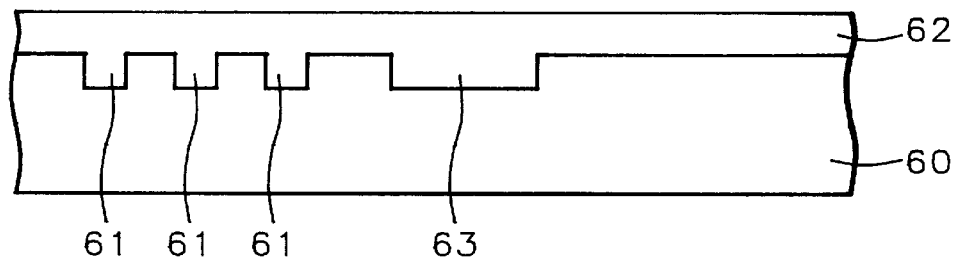

Following etchback of the unmasked insulating layer the mask is removed, as illustrated in FIG. 9. Planarization is then achieved using CMP (Chemical Mechanical Polishing), using a polishing slurry containing abrasive particles and a chemical etchant. CMP removes raised portions of insulating material remaining on the substrate and results in the planarized structure, illustrated in FIG. 10. This combination of tailored insulating layer etchback and CMP results in improved planarization and a smooth insulating layer having improved thickness uniformity after planarization.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a planarized integrated circuit structure having planarized oxide layer portions which comprises:

providing said oxide layer on the surface of an integrated circuit structure;

applying a patterned mask layer over said oxide layer with mask regions in registry with depressed portions of said oxide layer and with a periodic array of masked and unmasked regions over the raised portions of said oxide layer, with the size and periodicity of said periodic array of masked and unmasked regions being chosen to enhance subsequent chemical/mechanical polish (CMP) removal uniformity;

etching exposed portions of said oxide layer through unmasked regions of said patterned mask layer to approximately the same height as the height of said depressed portions of said oxide layer;

removing said patterned mask layer; and chemical/mechanical polishing (CMP) the remaining portions of said oxide layer to obtain a planarized oxide layer having uniform thickness and a smooth surface.

2. The method of claim 1, wherein said periodic array of masked and unmasked regions over the raised portions of said oxide layer have masked area features with dimensions between about 0.3 $\mu$m by 0.3 $\mu$m to 1.0 $\mu$m by 1.0 $\mu$m, placed in a periodic array with spacing between about 0.3 $\mu$m and 0.5 $\mu$m between said masked area features.

3. The method of claim 1, wherein said patterned mask layer is photoresist.

4. A method of fabrication of a planarized integrated circuit structure having a patterned metallization interconnection structure thereon, which comprises:

forming said patterned metallization interconnection structure on the integrated circuit structure;

depositing a conformal oxide layer over said patterned metallization interconnection structure;

forming a patterned mask layer over said conformal oxide layer with mask regions in registry with depressed portions of said conformal oxide layer and with a periodic array of masked and unmasked regions over the raised portions of said conformal oxide layer, with the size and periodicity of said periodic array of masked and unmasked regions being chosen to enhance subsequent oxide layer chemical/mechanical polish (CHP) removal uniformity;

etching exposed portions of said conformal oxide layer through unmasked regions of said patterned mask layer to approximately the same height as the height of said depressed portions of said conformal oxide layer;

removing said patterned mask layer; and chemical/mechanical polishing (CMP) the remaining portions of said conformal oxide layer to obtain a planarized oxide layer having uniform thickness and a smooth surface.

5. The method of claim 4, wherein said periodic array of masked and unmasked regions over the raised portions of said conformal oxide layer have masked area features with dimensions between about 0.3 $\mu$m by 0.3 $\mu$m to 0.5 $\mu$m by 0.5 $\mu$m, placed in a periodic array with spacing between about 0.3 $\mu$m and 0.5 $\mu$m between said masked area features.

6. The method of claim 4, wherein said patterned mask layer is photoresist.

7. A method of fabrication of a planarized integrated circuit structure having an etched pattern in a silicon substrate, which comprises:

forming said etched pattern in a silicon substrate;

depositing a conformal oxide layer over said etched pattern in a silicon substrate;

forming a patterned mask layer over said conformal oxide layer with mask regions in registry with depressed portions of said conformal oxide layer and with a periodic array of masked and unmasked regions over the raised portions of said conformal oxide layer, with the size and periodicity of said periodic array of masked and unmasked regions being chosen to enhance subsequent oxide layer chemical/mechanical polish (CMP) removal uniformity;

etching exposed portions of said conformal oxide layer through unmasked regions of said patterned mask layer to approximately the same height as the height of said depressed portions of said conformal oxide layer;

removing said patterned mask layer; and chemical/mechanical polishing (CMP) the remaining portions of said conformal oxide layer to obtain a planarized oxide layer having uniform thickness and a smooth surface.

8. The method of claim 7, wherein said periodic array of masked and unmasked regions over the raised portions of said conformal oxide layer have masked area features with dimensions between about 0.3 $\mu$m by 0.3 $\mu$m 0.5 $\mu$m by 0.5 $\mu$m, placed in a periodic array with spacing between about 0.3 $\mu$m and 0.5 $\mu$m between said masked area features.

9. The method of claim 7, wherein said patterned mask layer is photoresist.

* * * * *